United States Patent
Gulyas et al.

(10) Patent No.: US 9,845,387 B2
(45) Date of Patent: Dec. 19, 2017

(54) TOUGHENED EPOXY THERMOSETS CONTAINING CORE SHELL RUBBERS AND POLYOLS

(71) Applicant: Blue Cube IP LLC, Midland, MI (US)

(72) Inventors: Gyongyi Gulyas, Lake Jackson, TX (US); Maurice J. Marks, Lake Jackson, TX (US)

(73) Assignee: BLUE CUBE IP LLC, Midland, MI (US)

( * ) Notice: Subject to any disclaimer, the term of this patent is extended or adjusted under 35 U.S.C. 154(b) by 10 days.

(21) Appl. No.: 14/433,962

(22) PCT Filed: Oct. 13, 2013

(86) PCT No.: PCT/US2013/064744
§ 371 (c)(1),
(2) Date: Apr. 7, 2015

(87) PCT Pub. No.: WO2014/062530
PCT Pub. Date: Apr. 24, 2014

(65) Prior Publication Data
US 2015/0274962 A1   Oct. 1, 2015

Related U.S. Application Data

(60) Provisional application No. 61/715,931, filed on Oct. 19, 2012.

(51) Int. Cl.
| | |
|---|---|
| C08L 63/00 | (2006.01) |
| C08L 51/00 | (2006.01) |
| C08G 59/42 | (2006.01) |
| H01L 21/67 | (2006.01) |
| H01L 21/687 | (2006.01) |
| H05B 3/00 | (2006.01) |

(52) U.S. Cl.
CPC .............. *C08L 63/00* (2013.01); *C08G 59/42* (2013.01); *H01L 21/67115* (2013.01); *H01L 21/6875* (2013.01); *H05B 3/0047* (2013.01); *C08L 2205/03* (2013.01); *C08L 2205/06* (2013.01); *C08L 2207/53* (2013.01)

(58) Field of Classification Search
None
See application file for complete search history.

(56) References Cited

U.S. PATENT DOCUMENTS

| | | | | |
|---|---|---|---|---|
| 2,982,752 | A * | 5/1961 | Phillips | C08G 59/027 156/330 |
| 5,789,482 | A * | 8/1998 | Eldin | C08G 59/4284 523/457 |
| 2004/0087681 | A1* | 5/2004 | Shah | C08G 59/4215 523/201 |
| 2010/0104832 | A1 | 4/2010 | Messe et al. | |
| 2010/0292415 | A1 | 11/2010 | Reynolds et al. | |
| 2011/0319523 | A1 | 12/2011 | Ji et al. | |
| 2012/0095133 | A1* | 4/2012 | Vyakaranam | C08L 63/00 523/435 |
| 2013/0096232 | A1* | 4/2013 | Theophanous | C08G 59/027 523/400 |
| 2013/0131217 | A1* | 5/2013 | Karunakaran | C08G 59/42 523/456 |
| 2014/0079953 | A1* | 3/2014 | Esseghir | C08G 59/226 428/413 |
| 2014/0256909 | A1* | 9/2014 | Marks | C08G 59/24 528/406 |
| 2015/0183976 | A1* | 7/2015 | Banda | C08J 3/005 428/195.1 |
| 2015/0210906 | A1* | 7/2015 | Liang | C09J 163/00 523/427 |

FOREIGN PATENT DOCUMENTS

| | | | | |
|---|---|---|---|---|
| WO | WO 2007/025007 A1 * | 3/2007 | | C08L 51/04 |
| WO | 2011016385 A1 | 2/2011 | | |
| WO | 2011048022 A2 | 4/2011 | | |
| WO | 2011/119216 A2 * | 9/2011 | | |
| WO | 2014/062475 A2 * | 4/2014 | | |
| WO | 2014149074 | 9/2014 | | |

OTHER PUBLICATIONS

PCT/US2013/064744, International Search Report and Written Opinion dated May 16, 2014.
PCT/US2013/064744, International Preliminary Report on Patentability Apr. 30, 2015.
European Application No. 13783763.9 Examination Report dated Jul. 21, 2016.
European Application No. 13783763.9 communication under Rule 71(3) EPC Intention to Grant dated Jan. 18, 2017.

* cited by examiner

*Primary Examiner* — Ana Woodward
(74) *Attorney, Agent, or Firm* — Polsinelli PC

(57) ABSTRACT

A curable resin composition comprising: a) an epoxy resin; b) an anhydride hardener; c) a polyol; d) a core shell rubber, and (e) a catalyst, is disclosed. When cure the resin composition can be used to formulate composites, coatings, laminates, and adhesives.

13 Claims, 1 Drawing Sheet

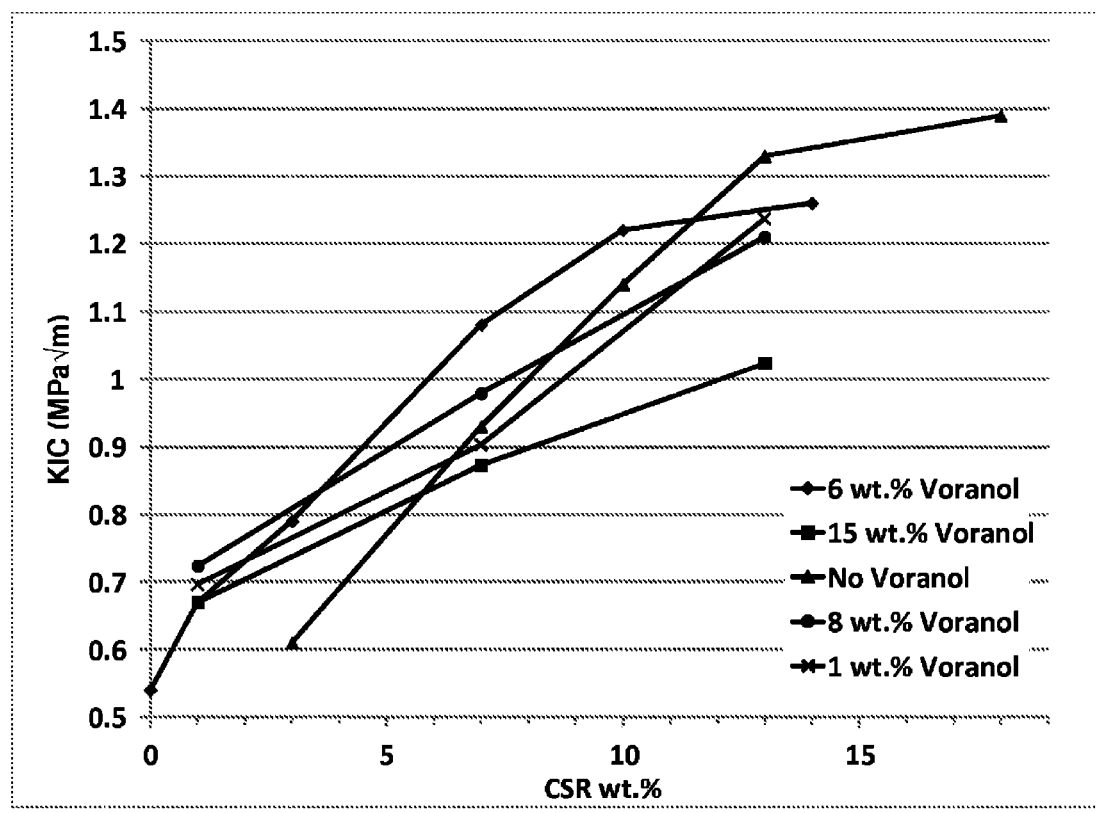

TOUGHENED EPOXY THERMOSETS CONTAINING CORE SHELL RUBBERS AND POLYOLS

BACKGROUND OF THE INVENTION

Field of the Invention

The present invention is related to toughening epoxy resin compositions; and more specifically, the present invention is related to the use of a polyol and core shell rubber (CSR) toughening agents in epoxy resin compositions.

Background

There are various known methods for toughening epoxy-anhydride thermosets using a number of available known toughening agents such as CSRs or polyols. A major disadvantage in the use of CSRs as toughening agents in epoxy formulations is the significant increase in formulation viscosity. Compared to CSRs, polyols provide a lesser increase of the formulation viscosity, but they do not provide the same degree of increase in fracture toughness and induce a lower thermoset glass transition temperature ($T_g$).

It is therefore desired to provide a curable epoxy formulation with a toughening agent that will improve the toughness of the formulation with a minimal increase in formulation viscosity and with no decrease or detrimental affect on the $T_g$ of the final thermoset made from the epoxy formulation.

SUMMARY OF THE INVENTION

The present invention is directed to the use of polyol and core shell rubber (CSR) toughening agents in certain total amounts and ratios for toughening an epoxy-anhydride formulation without compromising some of the mechanical and thermal properties of the thermoset such $T_g$ and providing good processability.

Advantageously, the use of polyol and core shell rubber (CSR) toughening agents in a curable epoxy formulation provide a low viscosity for improved processing and a thermoset product with an improved toughness without sacrificing final $T_g$ of the resulting thermoset.

One embodiment of the present invention is directed to a curable resin composition or system (or formulation) comprising, consisting of, or consisting essentially of (a) at least one epoxy resin; (b) at least one anhydride curing agent; (c) at least one polyol (d) at least one core shell rubber (CSR); and (e) at least one curing catalyst.

BRIEF DESCRIPTION OF THE FIGURE

FIG. 1 is a plot of core shell rubber weight percent versus fracture toughness ($K_{IC}$).

DETAILED DESCRIPTION OF THE INVENTION

Epoxy Resin

The present invention curable composition includes at least one epoxy resin, component (a). The epoxy resin may be saturated or unsaturated, aliphatic, cycloaliphatic, aromatic or heterocyclic and may be substituted. The epoxy resin may also be monomeric or polymeric. An extensive enumeration of epoxy resins useful in the present invention is found in Lee, H. and Neville, K., "Handbook of Epoxy Resins," McGraw-Hill Book Company, New York, 1967, Chapter 2, pages 257-307; incorporated herein by reference.

The epoxy resin, used in embodiments disclosed herein for component (a) of the present invention, may vary and include conventional and commercially available epoxy resins, which may be used alone or in combinations of two or more. In choosing epoxy resins for compositions disclosed herein, consideration should not only be given to properties of the final product, but also to viscosity and other properties that may influence the processing of the resin composition.

Particularly suitable epoxy resins known to the skilled worker are based on reaction products of polyfunctional alcohols, phenols, cycloaliphatic carboxylic acids, aromatic amines, or aminophenols with epichlorohydrin. A few non-limiting embodiments include, for example, bisphenol A diglycidyl ether, bisphenol F diglycidyl ether, resorcinol diglycidyl ether, and triglycidyl ethers of para-aminophenols. Other suitable epoxy resins known to the skilled worker include reaction products of epichlorohydrin with o-cresol and, respectively, phenol novolacs. Further epoxy resins include epoxides of divinylbenzene or divinylnaphthalene. It is also possible to use a mixture of two or more epoxy resins.

The epoxy resins, component (a), useful in the present invention for the preparation of the curable compositions, may be selected from commercially available products; for example, D.E.R®. 331, D.E.R. 332, D.E.R. 383, D.E.R. 334, D.E.R. 580, D.E.N. 431, D.E.N. 438, D.E.R. 736, or D.E.R. 732 epoxy resins available from The Dow Chemical Company or Syna 21 cycloaliphatic epoxy resin from Synasia. As an illustration of the present invention, the epoxy resin component (a) may be a mixture of a liquid epoxy resin, such as D.E.R. 383, an epoxy novolac DEN 438, a cycloaliphatic epoxide Syna 21, and a divinylarene dioxide, divinylbenzene dioxide (DVBDO) and mixtures thereof.

In some embodiments, the epoxy resin mixture may be present in the curable composition in an amount ranging from about 10 weight percent (wt. %) to about 90 wt. % of the curable composition, based on the total weight of the curable composition, including the epoxy resin, the anhydride curing agent, the polyol, CSR and the catalyst. In other embodiments, the epoxy composition may range from about 20 wt. % to about 80 wt. % of the curable composition; in other embodiments; from about 30 wt. % to about 70 wt. %.

Anhydride Curing Agent

The curing agent (also referred to as a hardener or cross-linking agent), component (b), useful for the curable epoxy resin composition of the present invention, may comprise cycloaliphatic and/or aromatic anhydrides; and mixtures thereof.

Cycloaliphatic anhydride hardeners may include, for example, nadic methyl anhydride, hexahydrophthalic anhydride, tetrahydrophthalic anhydride, methyl tetrahydrophthalic anhydride, methyl hexahydrophthalic anhydride and their derivatives among others; and mixtures thereof. Aromatic anhydrides may include, for example, phthalic anhydride, trimellitic anhydride and mixtures thereof. Anhydride curing agent may also include copolymers of styrene and maleic anhydride and other anhydrides described, for example, in U.S. Pat. No. 6,613,839 and Epoxy Resins Chemistry and Technology, ed. C. A. May, Y. Tanaka, Marcel Dekker Inc. 1973 New York, p 273-280, incorporated herein by reference.

In some embodiments, the anhydride hardener or a mixture of anhydride hardeners may be present in the curable composition in an amount ranging from about 10 wt. % to about 90 wt. % of the curable composition, based on the total weight of the epoxy resin mixture, the anhydride hardener, the polyol, CSR and the catalyst. In other embodiments, the anhydride hardener may generally range from about 20 wt. % to about 80 wt. % of the curable composition; such as, for example, from about 30 wt. % to about 70 wt. %.

Polyol

Generally, the polyol component, component C, comprises a polyol or a mixture of polyols with a number average molecular weight of greater than about 2,000 to about 20,000, from about 3,000 to about 15,000 in other embodiments, and from about 4,000 to about 10,000 in yet other embodiments.

The average functionality of the polyol component is in the range of from 1.5 to 5.0. The average functionality of the polyol component is in the range of 2 to 4 in another embodiment.

Examples of the polyol component include, but are not limited to polyether polyols, such as polypropylene oxide, polybutylene oxide, polyethylene oxide, and polytetramethylene ether glycol commercially available from the Dow Chemical Company as VORANOL® polyols, from the Arch Chemical Company as Poly G® glycol, from Invista as TERATHANE®, and from the Bayer Corporation ACCLAIM® polyol, polyester polyols, such as polyethylene adipate, polybutylene adipate, polypropylene adipate, polyethylene propylene adipate, polyethylene butylene adipate, and the like, mixtures and copolymers thereof commercially available from Chemtura as FOMREZ® polyester polyols, and from The Dow Chemical Company as DIOREZ® polyester polyols, a polycaprolactone polyol, such as CAPA® caprolactone polyols from Perstorp and PLACCEL® caprolactone polyols from Daicel, polycarbonate polyols, such as Oxymer M112 from Perstorp, hydroxyl-terminated polybutadienes, such as KRASOL® from SARTOMER, and mixtures and copolymers of the above.

In some embodiments, the polyol may be present in the curable composition in an amount ranging from about 1 wt. % to about 30 wt. %. In other embodiments, the polyol may be present in an amount ranging from about 1 wt. % to about 20 wt. %; from about 2 wt. % to about 15 wt. % in other embodiments; and from about 3 wt. % to about 10 wt. % in yet other embodiments, wherein the above ranges are based on the total weight of the epoxy resin mixture, the anhydride hardener, the polyol, CSR and the catalyst.

CSR

The core shell rubber, component (d) used in the present invention comprises a rubber particle core and a shell layer. The core shell rubber generally has a particle size in the range of from 0.01 µm to 0.8 µm. The core shell rubber has a particle size in the range of from 0.05 µm to 0.5 µm, in another embodiment, and in the range of from 0.08 µm to 0.30 µm in yet another embodiment.

The core shell rubber is a polymer comprising a rubber particle core formed by a polymer comprising an elastomeric or rubbery polymer as a main ingredient, optionally having an intermediate layer formed with a monomer having two or more double bonds and coated on the core layer, and a shell layer formed by a polymer graft polymerized on the core. The shell layer partially or entirely covers the surface of the rubber particle core by graft polymerizing a monomer to the core.

Generally the rubber particle core is constituted from acrylic or methacrylic acid ester monomers or diene (conjugated diene) monomers or vinyl monomers or siloxane type monomers and combinations thereof.

The shell layer provides compatibility to the formulation and has limited swellability to facilitate mixing and dispersion of the CSR particles in the resin or hardener of the current invention. In one embodiment the shell does not have reactive groups towards the epoxy resin or the hardener of the present invention. Yet in another embodiment the shell might have reactive groups towards the epoxy resin or the hardener, for example epoxide or carboxylic acid groups.

CSR, component (d), useful in the present invention for the preparation of the curable compositions, may be selected from commercially available products; for example, Paraloid EXL 2650A, EXL 2655, EXL2691 A, each available from The Dow Chemical Company, or Kane Ace® MX series from Kaneka Corporation, such as MX 120, MX 125, MX 130, MX 136, MX 551, or METABLEN SX-006 available from Mitsubishi Rayon.

Generally, the CSR component, component (d), may be present in the curable composition in an amount ranging from about 1 wt. % to about 25 wt. %. In other embodiments, the CSR may be present in an amount ranging from about 2 wt. % to about 20 wt. %; from about 3 wt. % to about 15 wt. % in other embodiments; wherein the above ranges are based on the total weight of the epoxy resin mixture, the anhydride hardener, the polyol, CSR and the catalyst.

The present invention uses two different toughening agents, a polyol and a CSR. The relative and total amounts of the toughening agents is also important regarding obtaining minimum viscosity of the combination of anhydride, CSR, and polyol, and reaching maximum fracture toughness and preserving $T_g$ of the cured epoxy thermoset prepared using the present invention. Generally, the minimum of the weight ratio of CSR to polyol in the curable composition may range from about 0.1 to about 2, preferably from about 0.5 to about 2. The maximum of the weight ratio of CSR to polyol in the curable composition may range from about 2 to about 15, such as, for example, from about 2 to about 7. Generally, the combined minimum amount of the polyol and CSR in the curable composition may range from 2 wt. % to about 10 wt. %, such as, for example, 3 wt. % to about 5 wt. %. The combined maximum amount of the polyol and CSR in the curable composition may range from 8 wt. % to about 30 wt. %, such as, for example, 10 wt. % to about 20 wt. %. In some embodiments, the minimum percentage increase in viscosity of the combined anhydride, CSR, and polyol compared to the anhydride alone may range from about 50 to about 500, preferably from about 100 to about 500.

Catalyst

The catalyst component (e) of the epoxy resin composition of the present invention is a compound used to facilitate the curing of the formulation, and may include for example, at least one tertiary amine, including phenolic substituted ones; at least one boric acid-amine complex; at least one boron trifluoride-amine complex; at least one imidazole or substituted imidazole; at least one metal acetylacetonate (as described for example in Z. Zhang, C. P. Wong, Study on the Catalytic Behavior of Metal Acetylacetonates for Epoxy Curing Reactions, Journal of Applied Polymer Science, Vol. 86, 1572-1579 (2002)); at least one transition metal (for example cobalt, nickel, zinc, chromium, iron, copper) salt; at least one quaternary ammonium or phosphonium salts; at least one phosphine or substituted phosphine compound; or a combination thereof. Numerous catalyst or accelerators are described, for example, in Epoxy Resins Chemistry and Technology, ed. C. A. May, Y. Tanaka, Marcel Dekker Inc. 1973 New York, p 273-280, incorporated herein by reference.

In some embodiments, a catalyst may be present in the curable composition in an amount ranging from 0 wt. % to about 10 wt. % or from about 0.01 wt. % to about 7 wt. %. In other embodiments, the catalyst may be present in an amount ranging from about 0.1 wt. % to about 6 wt. %; from about 0.5 wt. % to about 5 wt. % in other embodiments; wherein the above ranges are based on the total weight of the epoxy resin mixture, the anhydride hardener, the polyol, the CSR and the catalyst. The reaction of epoxy and anhydride curing agent may be slow or may not occur outside the above concentration ranges of the catalyst.

Optional Components

The curable or thermosettable composition of the present invention may optionally contain one or more other additives which are useful for their intended uses. For example, the optional additives useful in the present invention composition may include, but not limited to, non-reactive diluents, stabilizers, surfactants, flow modifiers, pigments or dyes, matting agents, degassing agents, flame retardants (e.g., inorganic flame retardants, halogenated flame retardants, and non-halogenated flame retardants such as phosphorus-containing materials), curing initiators, curing inhibitors, wetting agents, colorants or pigments, thermoplastics, processing aids, UV blocking compounds, fluorescent compounds, UV stabilizers, inert fillers, fibrous reinforcements, antioxidants, impact modifiers including thermoplastic particles, and mixtures thereof. The above list is intended to be exemplary and not limiting. The preferred additives for the, formulation of the present invention may be optimized by the skilled artisan.

Curable compositions may also include from 0 wt. % to about 70 wt. % optional additives in some embodiments; and from about 0.1 wt. % to about 50 wt. % optional additives in other embodiments based on the total weight of the curable composition. In other embodiments, curable compositions may include from about 0.1 wt. % to about 10 wt. % optional additives; and from about 0.5 wt. % to about 5 wt. % optional additives in yet other embodiments.

Process for Producing the Composition

In an embodiment of the invention, there is disclosed a process for preparing the above-mentioned composition comprising, consisting of, or consisting essentially of two steps. The first step is dispersing the core shell rubber into an epoxy component, or a hardener component, or a polyol component. The second step is admixing the CSR dispersion with the appropriate amounts of the epoxy resin, the anhydride hardener, the polyol and the catalyst.

In an embodiment, the first step, CSR dispersion is prepared with a high shear mixer in a dispersion zone under dispersion conditions wherein said dispersion zone does not contain a solvent and wherein said dispersion conditions comprise a dispersion temperature of 40° C. to 100° C., a Reynolds Number greater than 10, and a dispersion time of from 30 minutes to 300 minutes.

In an embodiment, the high speed mixer is equipped with a variable speed control, a temperature probe and a cowles mixing blade or variations of a cowles. To achieve the best mixing results, the diameter of the cowles mixing blade (D) is generally between 0.2 to 0.7 of the diameter of the vessel (T) (D/T=0.2-0.7), between 0.25 to 0.50 in another embodiment, and between 0.3 to 0.4 in yet another embodiment. The blade clearance from the bottom of the vessel is generally 0.2 D to 2.0 D, 0.4 D to 1.5 D in another embodiment, and 0.5 D to 1.0 D in yet another embodiment. The height of the mixture (H) is generally between 1.0 D to 2.5 D, between 1.25 D to 2.0 D in another embodiment, and between 1.5 D to 1.8 D in yet another embodiment. The dispersion zone generally has a dispersion temperature in the range of from 0° C. to 100° C. The dispersion zone has a dispersion temperature in the range of from 25° C. to 90° C. in another embodiment, and a dispersion temperature in the range of from 60° C. to 80° C. in yet another embodiment.

The Reynolds number is a measure of the ratio of inertial forces to viscous forces. Generally, the dispersion zone is maintained at a Reynolds number of greater than 10. The dispersion zone is maintained at a Reynolds number of greater than 100 in another embodiment and is maintained at a Reynolds number of greater than 300 in yet another embodiment.

The dispersion zone is maintained at the dispersion conditions for as long as necessary to achieve a uniform, single/discrete particle dispersion. In an embodiment, the dispersion zone is maintained at the dispersion conditions for a time in the range of 30 minutes to 300 minutes. In an embodiment, a vacuum can be applied to remove any entrapped air.

In an embodiment, the dispersion formed by this process contain 5 wt. % to 45 wt. % of polymer particles. The dispersion formed contains 10 wt. % to 40 wt. % of polymer particles in another embodiment, and contain 25 wt. % to 30 wt. % of polymer particles in yet another embodiment.

The second step of the preparation of the curable epoxy resin composition of the present invention is achieved by admixing the reaction components above. For example, the epoxy resin, the curing agent, the polyol, the CSR dispersion, and the catalyst, may be added to a mixing vessel; and the components are then formulated into an epoxy resin composition by mixing. There is no criticality to the order of mixture, i.e., the components of the formulation or composition of the present invention may be admixed in any order to provide the curable composition of the present invention.

Any of the above-mentioned optional assorted formulation additives, for example fillers, may also be added to the composition during the mixing or prior to the mixing to form the curable composition.

All the components of the epoxy resin composition are typically mixed and dispersed at a temperature enabling the preparation of an effective epoxy resin composition having a low viscosity for the desired application. The temperature during the mixing of all components may be generally from about 0° C. to about 100° C. and preferably from about 20° C. to about 50° C.

Curable Composition

Curable compositions may be formed, as described above, by combining (1) an aromatic epoxy resin or a cycloaliphatic epoxy resin or a mixture of a cycloaliphatic epoxy resin, an aromatic epoxy resin cycloaliphatic resin, an epoxy phenolic novolac resin, an epoxy bisphenol A novolac resin, a multifunctional epoxy resin, a bisphenol-A or bisphenol F based epoxy resin, with (2) an anhydride hardener, (3) polyol, (4) CSR and (5) a catalyst. Additionally other additives may also be added, as described above. The relative proportions of the epoxy resin mixtures and the anhydride hardener may depend, in part, upon the properties desired in the curable composition or thermoset compositions to be produced, the desired cure response of the composition, and the desired pot life of the composition. "Potlife" herein means the time it takes to increase the viscosity to double or triple the initial viscosity of the formulation at application temperature.

The viscosity of the epoxy resin composition prepared by the process of the present invention ranges generally from about 0.1 Pa·s to about 500 Pa·s at 25° C.

Process for Curing the Composition

The curable epoxy resin formulation or composition of the present invention can be cured under conventional processing conditions to form a thermoset. The resulting thermoset displays excellent thermo-mechanical properties, such as good toughness and mechanical strength, while maintaining high thermal stability and high glass transition temperature ($T_g$).

The process to produce the thermoset products of the present invention may be performed by gravity casting, vacuum casting, automatic pressure gelation (APG), vacuum pressure gelation (VPG), infusion, filament winding, lay up injection, resin transfer molding, prepreging, dipping, coating, spraying, brushing, and the like.

The curing reaction conditions include, for example, carrying out the reaction under a temperature, generally in the range of from about 0° C. to about 300° C.; from about 20° C. to about 250° C. in other embodiments; and from about 50° C. to about 200° C. in yet other embodiments.

The pressure of the curing reaction may be carried out, for example, at a pressure of from about 0.01 bar to about 1000 bar; preferably, from about 0.1 bar to about bar 100; and more preferably, from about 0.5 bar to about 10 bar.

The curing of the curable or thermosettable composition may be carried out, for example, for a predetermined period of time sufficient to cure the composition. For example, the curing time may be chosen between about 1 minute to about 10 hours, preferably between about 2 minutes to about 5 hours, and more preferably between about 2.5 minutes to about 1 hours.

The curing process of the present invention may be a batch or a continuous process. The reactor used in the process may be any reactor and ancillary equipment well known to those skilled in the art.

Substrates

In one embodiment, the curable compositions described above may be dispensed on a substrate and cured. The substrate is not subject to particular limitation. As such, substrates may include metals, such as stainless steel, iron, steel, copper, zinc, tin, aluminum, and the like; alloys of such metals, and sheets which are plated with such metals and laminated sheets of such metals. Substrates may also include polymers, glass, and various fibers, such as, for example, carbon/graphite; boron; quartz; aluminum oxide; glass such as E glass, S glass, S-2 GLASS or C glass; and silicon carbide or silicon carbide fibers containing titanium. Commercially available fibers may include: organic fibers, such as KEVLAR® from DuPont; aluminum oxide-containing fibers, such as NEXTEL® fibers from 3M; silicon carbide fibers, such as NICALON® from Nippon Carbon; and silicon carbide fibers containing titanium, such as TYRANO® from Ube. In particular embodiments, the curable compositions may be used to form at least a portion of a carbon fiber composite, a circuit board or a printed circuit board. In some embodiments, the substrate may be coated with a compatibilizer to improve the wetting and/or adhesion of the curable or cured composition to the substrate.

Resulting Cured Product Properties

The cured or thermoset product prepared by curing the epoxy resin composition of the present invention advantageously exhibits an improved balance of processability and thermo-mechanical properties (e.g. pre-cured formulation viscosity, glass transition temperature, modulus, and fracture toughness). The combined use of the polyol and CSR provides formulations having lower viscosity, higher $T_g$, and comparable fracture toughness compared to using CSR alone. Combined use of polyol and CSR allows for lower levels of CSR while maintaining fracture toughness. The ability to decrease CSR levels in the formulation and maintain the fracture toughness significantly benefits processability because the viscosity of the formulation becomes 5-20 fold lower. Optimal polyol and CSR levels have increased fracture toughness without sacrificing the final $T_g$ of the resulting thermoset.

The $T_g$ of the thermoset product will depend on the curing agent and the epoxy resin used in the curable composition. In some embodiments, the $T_g$ of the cured epoxy resins of the present invention may be from about 100° C. to about 300° C.; and from about 100° C. to about 265° C. in other embodiments. In some embodiments, the percentage decrease in $T_g$ of the cured compositions of the present invention compared to an analogous composition lacking a CSR and/or polyol toughening agent may range from about 0 to about 10, and from about 0 to about 6 in other embodiments.

Similarly, the fracture toughness of the thermoset product will depend on the curing agent and the epoxy resin used in the curable composition. Generally, the fracture toughness of the cured epoxy resins of the present invention may be from about 0.4 MPa/m$^{1/2}$ to about 3 MPa/m$^{1/2}$; and more preferably from about 0.6 MPa/m$^{1/2}$ to about 2 MPa/m$^{1/2}$. In some embodiments, the percentage increase in fracture toughness of the cured compositions of the present invention compared to an analogous composition lacking a CSR and/or polyol toughening agent may range from about 40 to about 200, and from about 40 to about 150 in yet other embodiments.

End-Use Applications

The epoxy resin compositions of the present invention are useful for the preparation of epoxy thermosets or cured products in the form of castings, coatings, films, adhesives, laminates, composites (e.g., filament winding, pultrusion, resin transfer molding), encapsulants, potting compounds, and the like. In some embodiments, pultrusion, filament winding, casting, resin transfer molding, or vacuum infusion methods to process the epoxy resin compositions of the present invention are generally preferred.

As an illustration of the present invention, in general, the epoxy resin compositions may be useful for casting, potting, encapsulation, molding, and tooling. The present invention is particularly suitable for all types of electrical casting, potting, and encapsulation applications; for molding and plastic tooling; and for the fabrication of epoxy based composites parts, particularly for producing large epoxy-based parts produced by casting, potting and encapsulation. The resulting composite material may be useful in some applications, such as electrical casting applications or electronic encapsulations, castings, moldings, potting, encapsulations, injection, resin transfer moldings, composites, coatings and the like.

EXAMPLES

The following examples and comparative examples further illustrate the present invention in detail but are not to be construed to limit the scope thereof.

All chemicals were purchased from Sigma-Aldrich unless stated otherwise. D.E.N.™ 438™ epoxy-novolac resin ("DEN 438"), D.E.R.™ 331 liquid epoxy resin ("DER 331"), divinylbenzene dioxide, and PARALOID™ EXL 2650A CSR are commercially available from The Dow Chemical Company. "NMA" stands for nadic methyl anhydride and was obtained from Dixie Chemical Company. SYNA EPDXY 21 ("S-21") is 3,4-epoxy-cyclohexylmethyl-3,4-epoxy cyclohexane carboxylate and was obtained from Synasia. Voranol 4000 LM polyol is a poly(propylene oxide) polyol of number average molecular weight 4000 commercially available from Dow. Hycat 3000S is a Cr(III) containing catalyst from Dimension Technology Systems.

Abbreviations

"DMTA" stands for Dynamic Mechanical Thermal Analysis.

"ARES" stands for Advanced Rheometric Expansion System.

"$T_g$" stands for glass transition temperature.

"CSR" stands for core shell rubber.

"DVBDO" stands for divinylbenzene dioxide.

"1-MI" stands for 1-methylimidazole.

"Pa-s" stands for Pascal second.

"%" in the tables refer to the wt. % of a particular component in the final formulation that contains all the resin, hardener, catalyst and toughening agent components "mm" stands for millimeter.

"phr" means parts per hundred resin

In the Examples which follow the following analytical methods were used. Viscosity of the hardener (NMA with CSR and/or polyol and catalysts) was measured at 25° C. using an ARES rheometer from TA Instruments fitted with 50 mm plates and operated at an oscillating frequency of 1 Hz. DMTA was performed using an ARES solid-state analyzer. Rectangular samples roughly 62 mm×13 mm×3 mm were inserted into the solid state fixtures and subjected to an oscillatory torsional load. The shear storage modulus G', shear loss modulus G" and tan delta (G"/G') were recorded. An angular frequency of 1 Hz was used. Samples were subjected to a dynamic temperature ramp from room temperature (about 28° C.) to 300° C. at 3° C./minute. Thermoset $T_g$ is taken as the peak of the tan delta curve.

Fracture toughness of the cured product was measured using the compact tension sample geometry in accordance with ASTM D-5045.

Examples

Preparation of CSR Dispersion in NMA 1500 grams of NMA at room temperature was added to a 4 L open top metal container. The container was then placed under a high shear disperser equipped with a 50 mm diameter Cowles blade, a variable speed control and a temperature monitor. The Cowles blade was lowered to allow it to be immersed in the liquid. The height of the mixer to the bottom of the container was kept at 25 to 50 mm 500 grams of PARALOID™ EXL 2650A was added to the container gradually while the mixer was running at 1500 rpm. The mixing speed was increased to 2000 rpm after addition of the core shell rubber particles. After mixing for 75 minutes, a uniform, low viscosity, off-white dispersion of 25 wt. % CSR in NMA was achieved. Particle size was determined using Beckman Coulter LS13 320 laser diffraction instrument that was equipped with a Universal Liquid Module. Methylethyl ketone was used for dilutions. A particle size of 200 nm was obtained. A dispersion of 30 wt. % CSR in NMA was similarly prepared.

Preparation of Epoxy Resin A

To a round bottomed flask were added 56 phr S-21, 12 phr DER 331, 12 phr DEN 438, and 20 phr DVBDO. The components were mixed until homogeneous.

General Preparation Procedure of the Examples and Comparative Examples

The formulations as described in Table 1 were added to a 3-necked round bottomed flask fitted with a mechanical stirrer and connected to a vacuum system. Each mixture was slowly stirred to homogenize and then the flask was placed under vacuum to degas. When bubbling subsided the vacuum was released and the formulation was poured into a preheated (160° C.) mold with dimensions of 200×200×3.25 mm. The mold was immediately placed in a forced air convection oven and cured at 160° C. for 5 minutes. After 5 minutes the clear cast piece was removed from the mold and was cooled to ambient temperature. Then it was post cured at 200° C. for 20 minutes between two aluminum plates.

TABLE 1

Formulations for Examples 1-14 and Comparative Examples A-H.

| Example | CSR (wt. %) | Polyol (wt. %) | Resin A (g) | NMA (g) | 1MI (g) | Hycat (g) | CSR/NMA (g) | Polyol (g) |
|---|---|---|---|---|---|---|---|---|
| 1 | 1 | 1 | 41.01 | 51.99 | 1.00 | 1.00 | 4.00 | 1.00 |
| 2 | 7 | 1 | 38.44 | 30.56 | 1.00 | 1.00 | 28.00 | 1.00 |
| 3 | 13 | 1 | 35.88 | 9.12 | 1.00 | 1.00 | 52.00 | 1.00 |
| 4 | 1 | 6 | 39.04 | 49.36 | 1.00 | 1.00 | 4.00 | 5.60 |
| 5 | 3 | 6 | 38.19 | 42.21 | 1.00 | 1.00 | 12.00 | 5.60 |
| 6 | 7 | 6 | 36.48 | 27.92 | 1.00 | 1.00 | 28.00 | 5.60 |
| 7 | 10 | 6 | 35.20 | 17.20 | 1.00 | 1.00 | 40.00 | 5.60 |
| 8 | 14 | 6 | 33.49 | 2.91 | 1.00 | 1.00 | 56.00 | 5.60 |
| 9 | 1 | 8 | 38.02 | 47.98 | 1.00 | 1.00 | 4.00 | 8.00 |
| 10 | 7 | 8 | 35.45 | 26.55 | 1.00 | 1.00 | 28.00 | 8.00 |
| 11 | 13 | 8 | 32.89 | 5.11 | 1.00 | 1.00 | 52.00 | 8.00 |
| 12 | 1 | 15 | 35.03 | 43.97 | 1.00 | 1.00 | 4.00 | 15.00 |
| 13 | 7 | 15 | 32.46 | 22.54 | 1.00 | 1.00 | 28.00 | 15.00 |
| 14 | 13 | 15 | 29.90 | 1.10 | 1.00 | 1.00 | 52.00 | 15.00 |
| A | 0 | 0 | 41.86 | 56.14 | 1.00 | 1.00 | 0.00 | 0.00 |
| B | 3 | 0 | 40.58 | 45.42 | 1.00 | 1.00 | 12.00 | 0.00 |
| C | 7 | 0 | 38.87 | 31.13 | 1.00 | 1.00 | 28.00 | 0.00 |
| D | 10 | 0 | 37.59 | 20.41 | 1.00 | 1.00 | 40.00 | 0.00 |
| E | 13 | 0 | 36.31 | 9.69 | 1.00 | 1.00 | 52.00 | 0.00 |
| F | 18 | 0 | 34.17 | 3.83 | 1.00 | 1.00 | 60.00 | 0.00 |
| G | 0 | 6 | 39.47 | 52.93 | 1.00 | 1.00 | 0.00 | 5.60 |
| H | 0 | 13 | 36.31 | 48.69 | 1.00 | 1.00 | 0.00 | 13.00 |

CSR/NMA is 25 wt. % CSR in NMA for all examples and comparative examples except for Comparative Example F. CSR/NMA is 30 wt. % CSR in NMA for Comparative Example F.

The results of the examples and comparative examples are shown in Table 2, where R is the weight ratio of CSR to polyol, T is the total weight % of CSR and polyol, Delta V is the percentage change in viscosity of the hardener containing the toughening agents (NMA with CSR and/or polyol and catalysts) compared to the hardener alone (NMA), Delta T is the percentage change in $T_g$ of the thermoset made using the hardener containing the toughening agents (NMA with CSR and/or polyol) compared to the hardener alone (NMA), and Delta K is the percentage change in fracture toughness of the thermoset made using the hardener containing the toughening agents (NMA with CSR and/or polyol and catalysts) compared to the hardener alone (NMA). Tg and $K_{1C}$ of Comparative Example A were predicted using the method of Bicerano as described in Prediction of Polymer Properties, Dekker, New York, 1993.

6% polyol level (diamond symbols) resulted in improved fracture toughness in a wide CSR concentration region, up to 11% CSR concentration. Further increasing the CSR concentration did not result in further improvements in fracture toughness. Using higher levels of polyol the improvement diminished and over a certain CSR concentration, the presence of polyol resulted in lower fracture toughness than in the absence of it. For example using 8% polyol (round symbols) provided fracture toughness improvements till about 8% CSR level, above that CSR level the fracture toughness was lower than in the absence of polyol. At higher polyol concentration, for example at 15% polyol level (square symbols) the CSR concentration, where fracture toughness improvement could still be seen was lower, namely about 5%. As data shows the combined presence of a polyol and CSR has a beneficial effect on fracture toughness, but the beneficial effect is shown in a narrow concentration region, which is more likely dependent on the components of the system, the resin, the hardener and the toughening agents, the polyol and the CSR. The

TABLE 2

Results for Examples 1-14 and Comparative Examples A-H.

| Example | CSR (wt. %) | Polyol (wt. %) | Hardener Viscosity (Pa-s) | Thermoset $T_g$ (° C.) | $K_{1C}$ (MPa-m$^{0.5}$) | R | T | Delta V (%) | Delta T (%) | Delta K (%) |
|---|---|---|---|---|---|---|---|---|---|---|
| 1 | 1 | 1 | 0.490 | 233 | 0.7 | 1.0 | 2 | 76 | 1 | 40 |
| 2 | 7 | 1 | 1.210 | 231 | 0.9 | 7.0 | 8 | 335 | 0 | 80 |
| 3 | 13 | 1 | 3.214 | 230 | 1.2 | 13.0 | 14 | 1056 | 0 | 140 |
| 4 | 1 | 6 | 0.472 | 216 | 0.7 | 0.2 | 7 | 70 | −6 | 40 |
| 5 | 3 | 6 | 0.859 | 221 | 0.8 | 0.5 | 9 | 209 | −4 | 60 |
| 6 | 7 | 6 | 1.604 | 222 | 1.1 | 1.2 | 13 | 477 | −3 | 120 |
| 7 | 10 | 6 | 2.398 | 222 | 1.2 | 1.7 | 16 | 763 | −3 | 140 |
| 8 | 14 | 6 | 3.901 | 220 | 1.3 | 2.3 | 20 | 1303 | −4 | 160 |
| 9 | 1 | 8 | 0.434 | 222 | 0.7 | 0.1 | 9 | 56 | −3 | 40 |
| 10 | 7 | 8 | 1.271 | 221 | 1 | 0.9 | 15 | 357 | −4 | 100 |
| 11 | 13 | 8 | 3.510 | 221 | 1.2 | 1.6 | 21 | 1163 | −4 | 140 |
| 12 | 1 | 15 | 0.581 | 213 | 0.7 | 0.1 | 16 | 109 | −7 | 40 |
| 13 | 7 | 15 | 1.372 | 215 | 0.9 | 0.5 | 22 | 394 | −7 | 80 |
| 14 | 13 | 15 | 4.392 | 209 | 1 | 0.9 | 28 | 1480 | −9 | 100 |
| A | 0 | 0 | 0.278 | 230 | 0.5 | n/a | 0 | 0 | 0 | 0 |
| B | 3 | 0 | 0.664 | 223 | 0.6 | n/a | 3 | 139 | −3 | 20 |
| C | 7 | 0 | 1.289 | 224 | 0.9 | n/a | 7 | 364 | −3 | 80 |
| D | 10 | 0 | 1.727 | 218 | 1.1 | n/a | 10 | 521 | −5 | 120 |
| E | 13 | 0 | 2.944 | 222 | 1.3 | n/a | 13 | 959 | −3 | 160 |
| F | 18 | 0 | 8.608 | 222 | 1.4 | n/a | 18 | 2996 | −3 | 180 |
| G | 0 | 6 | 0.200 | 218 | 0.5 | 0.0 | 6 | −28 | −5 | 0 |
| H | 0 | 13 | 0.300 | 208 | 0.7 | 0.0 | 13 | 8 | −10 | 40 |

A pictorial summary of the dependence of fracture toughness on polyol and CSR levels in NMA cured DER331-DEN438-Syna-21 epoxy systems is shown in Error! Reference source not found. As expected, increasing CSR concentrations resulted in increased fracture toughness. The data plotted by the triangle symbols show how the fracture toughness changed with increasing CSR concentrations, when no polyol was present in the formulation. The other curves of FIG. 1 depict, how the fracture toughness changes when different levels of polyol are present together with the CSR. The strong dependence of fracture toughness on the level of polyol present is clearly seen. Unpredictably, there were different polyol, CSR concentration combinations when the fracture toughness was higher than in formulations with CSR only. However the polyol concentration has an optimal range. For example, using only 1% polyol (shown by the "x" symbols) did not improve fracture toughness compared to the case when only CSR is used, except when the CSR concentration is lower than about 6%. In contrary, present invention provides a toughening system composed of a polyol and CSR where the combined use of the two components provides improved fracture toughness compared to the individual use of the components. However, the relative amount of the two components is crucial. The beneficial effect of the polyol does not increase monotonically with the polyol concentration, but has a maximum in a certain concentration region and it declines outside of this region. The beneficial effect on mechanical properties is accompanied by the preservation of $T_g$.

The results show that the $T_g$ of formulations with no polyol present has a $T_g$ in a range of 218-230° C. The $T_g$ of examples 1-11 is also in the same 216-230° C. range, indicating that the combined use of 1-8% polyol with CSR did not result in noticeable $T_g$ depression. In other words using the appropriate level of CSR and polyol resulted in increased fracture toughness with the preservation of the $T_g$. On the other hand, higher polyol levels (13-15%) with CSR present showed lower $T_g$ values in the range of 208-215° C.

Regarding the industrial applicability of the invention, the combined use of CSR and polyol renders a lower viscosity to the formulation, since the concentration of the higher viscosity components such as the CSR can be decreased when it used together with a polyol and the thermal and mechanical properties will not be negatively affected. For example Example 6 is a formulation containing 6% polyol and 7% CSR and having a $T_g$ of 222° C. and $K_{JC}$ of 1.08 MPa√m. These properties are comparable to Comparative example D, a 10% CSR containing formulation with a $T_g$ of 218° C. and $K_{JC}$ of 1.14 MPa√m, allowing the decrease of the amount of CSR, the most viscous component in the formulation, consequently improving processability. Moreover, if an application requires a certain viscosity range, which is always the case, the CSR and polyol toughened systems may show more favorable properties that a CSR toughened system. For example, selecting comparable viscosity formulations from a CSR and polyol (such as Example 6) and from a CSR (such as Comparative Example C) toughened formulations, better mechanical properties can be obtained using the combined toughening of CSR and polyol. Example 6 shows a fracture toughness of 1.1 while Comparative Example C shows a fracture toughness of 0.9 MPa√m.

The invention claimed is:

1. A curable epoxy resin composition comprising:
   a. at least one liquid epoxy resin;
   b. at least one epoxy novolac resin;
   c. at least one cycloaliphatic epoxy resin;
   d. at least one divinylarene dioxide;
   e. at least one anhydride hardener;
   f. at least one aliphatic polyol
   g. a core shell rubber; and
   h. at least one catalyst;
   wherein the weight ratio of the core shell rubber to the polyol ranges from about 0.1:1 to 15:1;
   wherein the at least one liquid epoxy resin comprises bisphenol A diglycidyl ether, bisphenol F diglycidyl ether, or resorcinol diglycidyl ether; and
   wherein components a., b., c., and d. are each different.

2. The curable resin composition of claim 1 wherein the epoxy resins (a., b., c., and d.) are present in an amount in the range of from 10 weight percent to 90 weight percent, the at least one anhydride hardener is present in an amount in the range of from 10 weight percent to 90 weight percent, the at least one aliphatic polyol is present in an amount in the range of from 1 weight percent to 30 weight percent, the core shell rubber is present in an amount in the range of from 1 weight percent to 25 weight percent, and the at least one catalyst is present in an amount in the range of from 0.1 weight percent to 10 weight percent, based on the total weight of the curable resin composition.

3. The curable resin composition of claim 1, wherein the at least one anhydride hardener is selected from the group consisting of aromatic anhydrides, and cycloaliphatic anhydrides.

4. The curable resin composition of claim 1, wherein the at least one anhydride hardener is nadic-methyl-anhydride or methyl-tetrahydrophthalic anhydride.

5. The curable resin composition of claim 1, wherein the at least one aliphatic polyol is selected from the group consisting of aliphatic polyether polyols, aliphatic polyester polyols, and aliphatic polycarbonate polyols.

6. The curable resin composition in accordance with claim 5, wherein the at least one aliphatic polyol is selected from the group consisting of a polyether polyol derived from ethylene oxide, propylene oxide, butylene oxide, tetrahydrofuran or mixtures thereof, a polyester polyol derived from succinic acid, glutaric acid, adipic acid, or mixtures thereof copolymerized with ethylene glycol, 1,2-propanediol, 1,4-butanediol, 1,6-hexanediol, neopentyl glycol, diethylene glycol, glycerol, trimethylolpropane, or mixtures thereof, a polyester polyol derived from caprolactone, a polycarbonate polyol derived from ethylene glycol, 1,2-propanediol, 1,4-butanediol, 1,6-hexanediol, neopentyl glycol, diethylene glycol, glycerol, trimethylolpropane, or mixtures thereof copolymerized with a carbonate precursor.

7. The curable resin composition of claim 1 wherein the at least one aliphatic polyol component comprises an aliphatic polyol with a number average molecular weight of from 2000 to 12000 and an average functionality of 1.5 to 5.0.

8. The curable resin of claim 1, wherein the shell of the core shell rubber has limited swellability.

9. The curable resin of claim 1, wherein the coreshell rubber has a rubber particle core and a shell layer wherein said core shell rubber has a particle size of from 0.01 µm to 0.5 µm.

10. The curable resin composition of claim 1, wherein the at least one catalyst is selected from the group consisting of imidazoles, substituted imidazoles, quaternary ammonium salts, and chromium compounds.

11. A process for preparing a curable resin composition, the process comprises admixing:
   a. at least one liquid epoxy resin;
   b. at least one epoxy novolac resin;
   c. at least one cycloaliphatic epoxy resin;
   d. at least one divinylarene dioxide;
   e. at least one anhydride hardener;
   f. at least one aliphatic polyol
   g. a core shell rubber; and
   h. at least one catalyst;
   wherein the weight ratio of the core shell rubber to the at least one aliphatic polyol ranges from about 0.1:1 to 15:1;
   wherein the at least one liquid epoxy resin comprises bisphenol A diglycidyl ether, bisphenol F diglycidyl ether, or resorcinol diglycidyl ether;
   wherein components a., b., c., and d. are each different; and
   wherein the above composition is mixed using a high speed mixer.

12. A cured resin composition comprising:
   a. at least one liquid epoxy resin;
   b. at least one epoxy novolac resin;
   c. at least one cycloaliphatic epoxy resin;
   d. at least one divinylarene dioxide;
   e. at least one anhydride hardener;
   f. at least one aliphatic polyol
   g. a core shell rubber; and
   h. at least one catalyst;
   wherein the weight ratio of the core shell rubber to the at least one aliphatic polyol ranges from about 0.1:1 to 15:1;
   wherein the at least one liquid epoxy resin comprises bisphenol A diglycidyl ether, bisphenol F diglycidyl ether, or resorcinol diglycidyl ether; and
   wherein components a., b., c., and d. are each different.

13. An article made from the cured resin composition of claim 12, wherein the article is selected from the group consisting of a composite, a coating, a film, a laminate, and an adhesive.

* * * * *